(12) United States Patent
Wagou et al.

(10) Patent No.: US 7,348,515 B2
(45) Date of Patent: Mar. 25, 2008

(54) SOLDER DISPENSER

(75) Inventors: Tatsuya Wagou, Tokyo (JP); Toru Mizuno, Tokyo (JP); Osamu Shindo, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 11/279,693

(22) Filed: Apr. 13, 2006

(65) Prior Publication Data

US 2006/0237514 A1   Oct. 26, 2006

(30) Foreign Application Priority Data

Apr. 22, 2005   (JP) .............................. 2005-124607

(51) Int. Cl.
    *B23K 26/00*    (2006.01)
(52) U.S. Cl. .............................. 219/121.6; 219/121.37; 219/494
(58) Field of Classification Search ............. 219/121.6, 219/121.37, 494, 616; 278/180.21, 180.22, 278/179.1
    See application file for complete search history.

(56) References Cited

U.S. PATENT DOCUMENTS

| | | | |
|---|---|---|---|
| 5,467,913 A * | 11/1995 | Namekawa et al. | 228/41 |
| 5,977,512 A * | 11/1999 | Azdasht et al. | 219/121.63 |
| 6,119,919 A | 9/2000 | Kasulke | |
| 6,152,348 A | 11/2000 | Finn et al. | |
| 6,543,677 B2 * | 4/2003 | Pattanaik et al. | 228/246 |
| 7,164,097 B2 | 1/2007 | Shindo et al. | |

FOREIGN PATENT DOCUMENTS

| | | | |
|---|---|---|---|
| CN | 1593827 A | | 3/2005 |
| JP | 06023530 A | * | 2/1994 |
| JP | 11-509375 | | 8/1999 |
| JP | 11-514933 | | 12/1999 |
| JP | 2002-501439 | | 1/2002 |
| JP | 2002-76043 | | 3/2002 |
| JP | 2004-534409 | | 11/2004 |
| WO | WO 97/17191 | | 5/1997 |
| WO | WO 97/20654 | | 6/1997 |
| WO | WO 98/57774 | | 12/1998 |
| WO | WO 03/006197 A1 | | 1/2003 |

* cited by examiner

*Primary Examiner*—Mark Paschall
(74) *Attorney, Agent, or Firm*—Oblon, Spivak, McClelland, Maier & Neustadt, P.C.

(57) ABSTRACT

A solder dispenser provides a cylindrical dispensing container which has a solder inlet for introducing a solder member, and an opening portion for discharging the above-mentioned solder member to the external, and forms an internal space where the solder member can fall between the above-mentioned solder inlet and the above-mentioned opening portion, and a solder supply portion which is detachably mounted in the dispensing container and holds the solder member, wherein, in a state that a lid member is mounted in the above-mentioned dispensing container, the above-mentioned solder supply portion holds the above-mentioned solder member in the opening region of the above-mentioned solder inlet and the above-mentioned internal space becomes a closed space except the above-mentioned opening portion, and wherein, when holding of the solder member is released, the solder member falls inside a closed space to arrive at the opening portion.

5 Claims, 4 Drawing Sheets

SOLDER DISPENSER

BACKGROUND OF THE INVENTION

1. Field of the Invention

The present invention relates to a solder dispenser for supplying a solder member to a predetermined place.

2. Description of the Prior Art

Up to now, various mechanisms have been used as a mechanism which is an example of a solder dispenser, conveys a solder member, and is incorporated in a soldering apparatus. For example, a soldering apparatus equipped with a solder supply portion which rotates a multi-hole disk to supply a solder ball into a soldering apparatus intermittently is known. A conventional example of a soldering apparatus equipped with a solder supply portion using a multi-hole disk will be explained below with referring to drawings.

Figure 4:
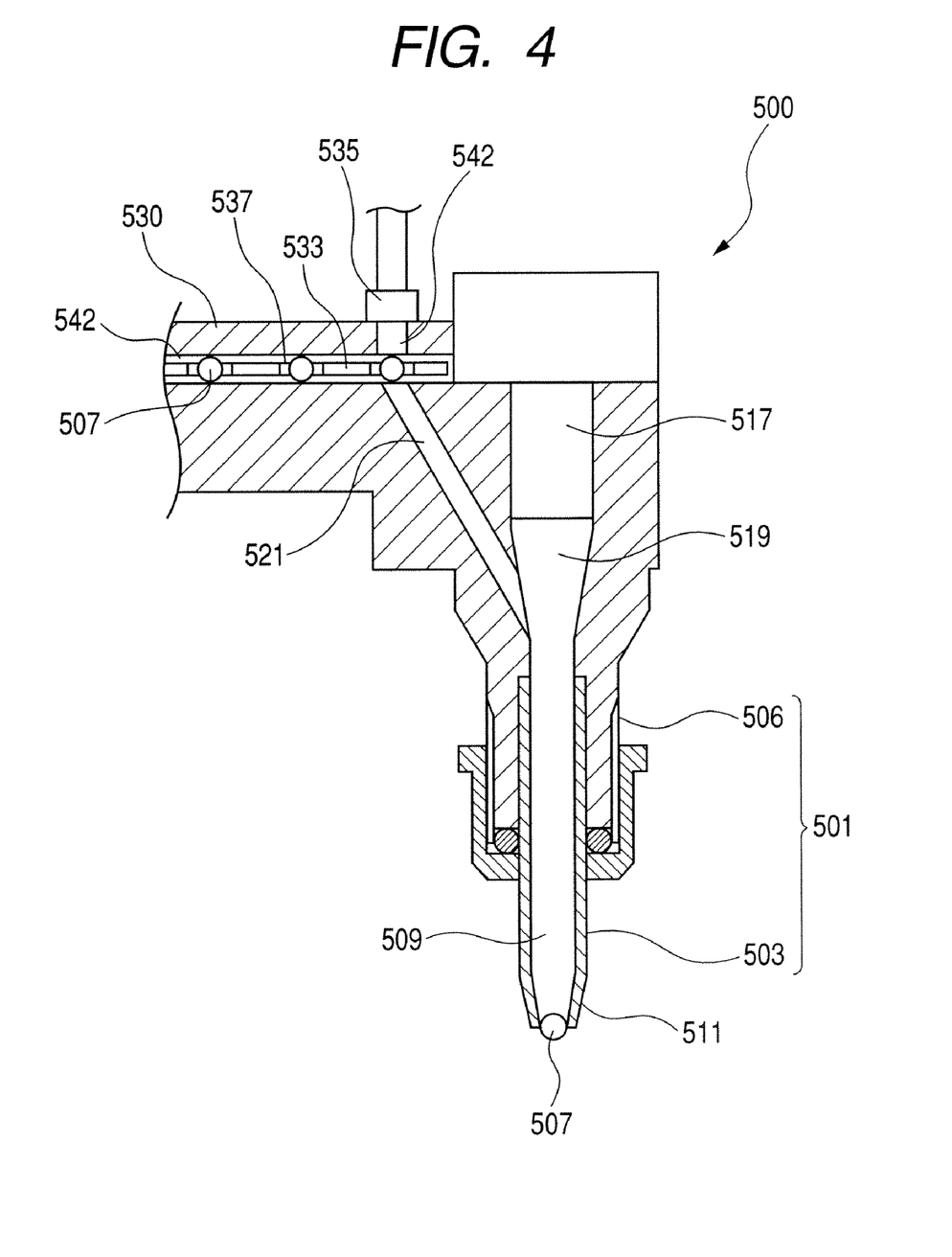
FIG. 4 is a partial sectional view of a conventional soldering apparatus.

FIG. 4 is a partial sectional view of the soldering apparatus equipped with a conventional solder supply portion. A conventional soldering apparatus 500 is equipped with a nozzle assembly 501, a solder supply portion for supplying a solder ball 507 to the nozzle assembly 501, laser equipment 517 for giving heat rays to a solder ball, and a gas supply portion 535 which supplies a compressed gas in order to inject the solder ball 507 which is melted.

The solder supply portion is equipped with a multi-hole disk 533 which receives the solder ball 507 from a storage portion, which stores the solder balls 507 but is not shown, and conveys it, and a driving portion which rotates the multi-hole disk 533, not shown, intermittently but is not shown.

Holding holes 537 are bored at equal intervals in an outer periphery side of the multi-hole disk 533, and one of the solder balls 507 is held in each of the holding holes 537. The multi-hole disk 533 holding the solder balls 507 is rotated, and conveys one of the solder balls 507 from a storage portion on an opening end portion of a solder introducing passage 521 which will be mentioned later. The solder ball 507 which reaches on the opening end portion advances into the solder introducing passage 521.

The nozzle assembly 501 is constituted by a nozzle 503 for injecting a solder ball 507, and a nozzle body 505 for supporting the nozzle 503.

The nozzle body 505 is equipped with a laser introducing passage 519 extended in a vertical direction, and the solder introducing passage 521 whose one end portion is connected to the laser introducing passage 519 and which is extended in a direction of inclining against the vertical direction. Another end portion of the solder introducing passage 521 opens near the multi-hole disk 533. In addition, the laser introducing passage 519 communicates with a containing portion 509 of the nozzle 503 mentioned later.

A tapered-off cylindrical nozzle 503 is equipped with the containing portion 509, an opening in a top side of the containing portion 509 communicates with the laser introducing passage 519 of the nozzle, and a lower opening is an opening portion 511 for injecting a solder. An internal diameter of the nozzle 503 is sized to be larger than an outer diameter of the solder ball 507 so that the solder ball 507 can roll, and is sized to be smaller than the outer diameter of the solder ball 507 near the opening portion 511. Therefore, the solder ball 507 which advances into the solder introducing passage 521 passes through the laser introducing passage 519 and containing portion 509 and is held by the opening portion 511 in the nozzle 503.

The solder ball 507 which is located in the opening portion 511 is melted by radiation of laser light from the laser equipment 517 to be injected to the external of the nozzle 503 by the compressed gas supplied through a gas inlet 541 and the solder introducing passage 521 from the gas supply portion 535 (Refer to Japanese Patent Application Laid-Open No. 11-534409 (FIG. 1)).

It becomes difficult that the multi-hole disk 533 of the conventional soldering apparatus 500 mentioned above holds solder balls securely in the holding holes 537 in connection with miniaturization of a diameter of a solder ball. In addition, since a solder ball is a soft material, there is a possibility that the solder ball may deform and chippings of the solder ball may be generated, by friction arisen in the solder ball when the multi-hole disk 533 rotates. As a result, there is a possibility that a solder ball may clog a holding hole 537 of the multi-hole disk 533. Since the multi-hole disk 533 rotates with a solder ball remaining in a holding hole 537 when the solder ball is clogged in the holding hole 537, there is a possibility of biting.

In addition, in the construction of supplying a compressed gas and injecting a solder ball 507, setting the compressed gas at a predetermined pressure value is an important factor which influences success or failure of an injection. Therefore, it is desirable to make a gas supply route, where a compressed gas reaches a solder ball, a closed space. Here, in the conventional example in FIG. 4, the gas supply route is constituted by the gas inlet 541 of a disk supporting section 539, a holding hole 537 of the multi-hole disk 533, the solder introducing passage 521, the laser introducing passage 519, and the containing portion 509.

Nevertheless, it is necessary to provide predetermined clearance also between a holding hole 537 and a solder ball 507, and, since the multi-hole disk 533 is a rotating member, it is necessary to provide a predetermined clearance 542 between the multi-hole disk 533 and disk supporting section 539 which supports the multi-hole disk 533. Hence, as for a gas supply route, originally, it is desirable for the gas inlet 541, holding hole 537, and solder introducing passage 521 to communicate without a gap. However, it is difficult by the clearance, which exists between the above-mentioned holding hole 537 and solder ball 507, and the clearance 542 of the multi-hole disk 533 which exists in the middle of the gas supply route to make the gas supply route into the closed space. Hence, gas supply pressure becomes unstable as a result.

For example, when a pressure value of a compressed gas becomes smaller than a predetermined value, there is a possibility of a solder member clogging a nozzle by viscosity of a melted solder member. On the contrary, although it is possible to eliminate influence of the viscosity when the compressed gas pressure is larger than a predetermined value, there is a possibility that the solder member which is melted scatters in the air, spreads on a surface of an object of soldering, or rebounds.

In addition, there is a limit of lessening size of the multi-hole disk, which conveys a solder member from a solder storage portion, because of necessity of holding a plurality of solder members, and it is difficult to make its construction further simpler.

SUMMARY OF THE INVENTION

Then, the present invention aims at providing a solder dispenser which does not cause solder clogging when conveying a solder member in the solder dispenser itself. Furthermore, the present invention aims at providing a solder dispenser which is equipped with a solder supply portion which can inject a solder member stably with making a gas supply route of a compressed gas a closed space, and which has simple construction and can be miniaturized.

An aspect of a soldering apparatus to which a solder dispenser of the present invention for solving the above-mentioned tasks is applied is that the soldering apparatus provides a nozzle assembly which has an internal space for containing a solder member, a solder inlet communicating with the above-mentioned internal space for introducing the above-mentioned solder member into the above-mentioned internal space, and an opening portion communicating with the above-mentioned internal space for discharging the above-mentioned solder member to the external, and a solder supply portion which is detachably mounted in the above-mentioned nozzle assembly and which holds the above-mentioned solder member, wherein the above-mentioned nozzle assembly or the above-mentioned solder supply portion has a heat ray route which introduces heat rays for melting the above-mentioned solder member into the above-mentioned internal space, wherein, in a state that the above-mentioned solder supply portion is mounted in the above-mentioned nozzle assembly, the above-mentioned solder supply portion holds the above-mentioned solder member in the opening region of the above-mentioned solder inlet and the above-mentioned internal space becomes a closed space except the above-mentioned opening portion.

According to the above-mentioned construction, when the solder supply portion is mounted in the nozzle assembly and the solder member is introduced into the internal space, the solder member closes the opening portion, and hence, it is possible to make the internal space into a closed state.

A solder dispenser of the present invention for solving the above-mentioned tasks is a solder dispenser for dispensing a solder member which provides a cylindrical dispensing container which has a solder inlet for introducing the above-mentioned solder member, and an opening portion for discharging the above-mentioned solder member to the external, and forms an internal space where the solder member can fall between the above-mentioned solder inlet and the above-mentioned opening portion, and a lid member which is detachably mounted in the above-mentioned dispensing container and which holds the above-mentioned solder member, wherein, in a state that the above-mentioned lid member is mounted in the above-mentioned dispensing container, the above-mentioned solder supply portion holds the above-mentioned solder member in the opening region of the above-mentioned solder inlet and the above-mentioned internal space becomes a closed space except the above-mentioned opening portion, and wherein, when holding of the above-mentioned solder member is released, the above-mentioned solder member falls inside the closed space to arrive at the above-mentioned opening portion.

According to the above-mentioned construction, when the lid member is mounted in the solder dispensing container and the solder member is introduced into the internal space, the solder member closes the opening portion, and hence, it is possible to make the internal space into a closed state.

DESCRIPTION OF THE PREFERRED EMBODIMENTS

Hereafter, embodiments where a solder dispenser of the present invention is applied to a soldering apparatus will be explained with referring to drawings. In each drawing, the same reference numerals are assigned to the same components.

Embodiment 1

Figure 1A:
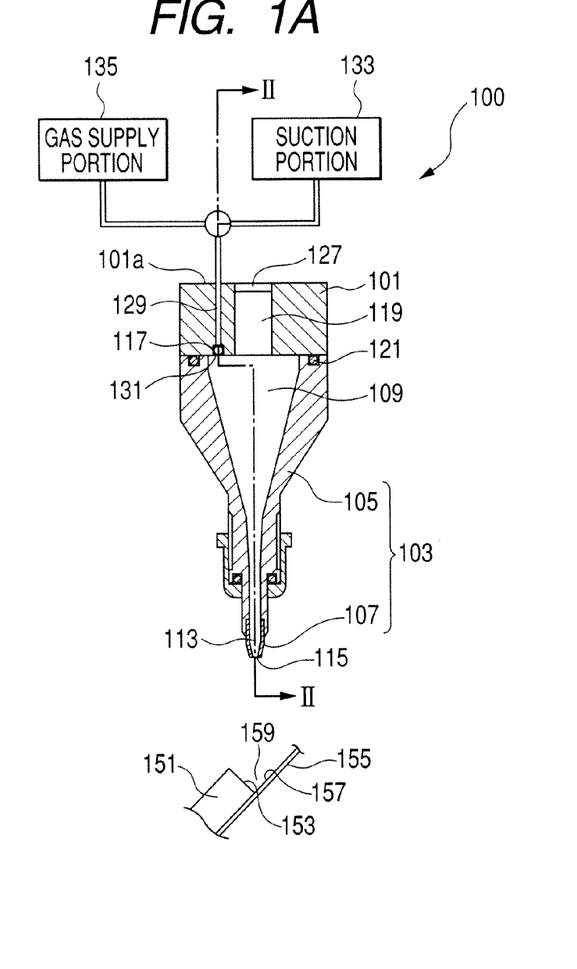
FIG. 1A is a partial sectional view of a soldering apparatus equipped with a solder supply portion according to a first embodiment of the present invention.
Figure 1B:
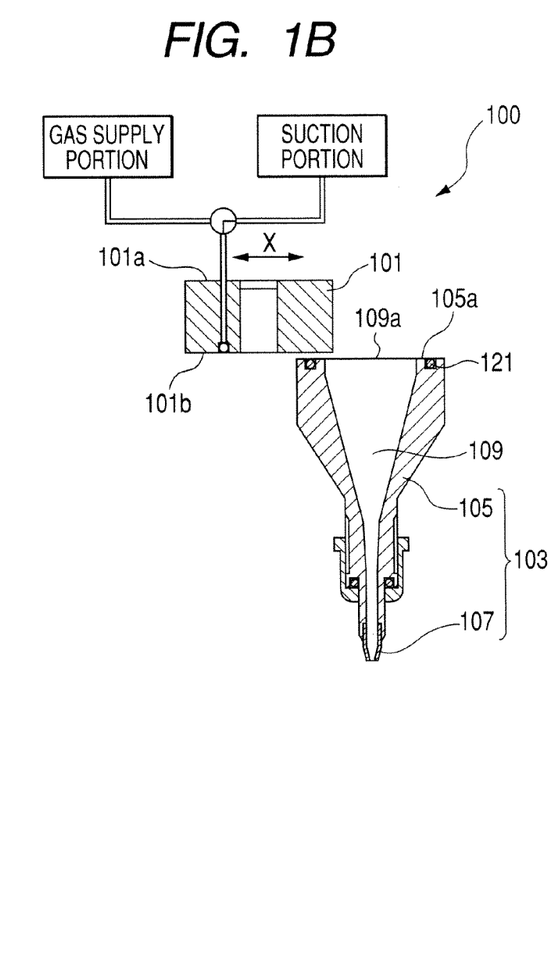
FIG. 1B is a partial sectional view of the soldering apparatus at the time of detaching the solder supply portion according to the first embodiment of the present invention.

FIG. 1A is a partial sectional view of a soldering apparatus equipped with a solder supply portion according to an embodiment of the present invention, and FIG. 1B is a partial sectional view of the soldering apparatus at the time of detaching the solder supply portion according to the embodiment of the present invention. The embodiment shown in FIGS. 1A and 1B is an apparatus which mainly performs soldering using a solder member, that is, a spherical solder ball 117 so as to electrically connect a slider electrode of an approximately rectangular slider (electronic part) for a magnetic head, and a flexure electrode made of a sheet-like flexure (substrate).

As for the slider 151 and the flexure 155, a slider electrode 153 and a flexure electrode 157 are arranged at an elevation angle of an approximately right angle, and the number of each electrode is at least four. The solder nozzle 107 concerned is positioned so as to correspond to an approximately center position in a width direction (a direction of a back and a front of paper in FIG. 1) of a groove 159 with an approximately right angle formed by each electrode of the slider 151 and flexure 155 which are temporary positioned with an adhesive or a grip mechanism. Electric connection of the electrodes is performed by injecting and melting the solder ball 131.

A soldering apparatus 100 is equipped with a solder supply portion 101 for conveying a solder member from a not-shown storage portion to a containing portion, that is, a lid member, and a nozzle assembly 103 for injecting the solder member, that is, a dispensing container.

The approximately cylindrical solder supply portion 101 is a member which is mounted detachably to the nozzle assembly 103, and functions also as a lid of the nozzle assembly 103. The solder supply portion 101 is equipped with a heat ray route along which laser light for melting a solder member passes. The heat ray route is constituted by a laser introducing passage 119 and a laser light transmission portion 127. The laser introducing passage 119 penetrates between a top face 101a and a lower face 101b which face each other in a lateral direction of the solder supply portion 101. An opening portion in a side of the top face 101a of the laser introducing passage 119 is sealed by the laser light transmission portion 127, which is constituted by a glass-containing material which can transmit laser light, and can transmit only laser light. The laser introducing passage 119 is opened at a side of the lower face 101b. In addition, when the solder supply portion 101 is mounted in the nozzle assembly 103, the laser introducing passage 119 communicates with an internal space 109 of the nozzle body 105 mentioned later.

Furthermore, the solder supply portion 101 is equipped with a suction passage 129, which penetrates between the top face 101a and lower face 101b, outward in a radial direction from the laser introducing passage 119. The suction passage 129 is connected to a suction portion 133 by an end portion at a side of the top face 101a. The suction passage 129 at a side of the lower face 101b continues to a single concavity 131 whose lower part opens. An inside of the concavity 131 is a hollow-like cylindrical groove. A diameter of an inner circumferential wall of the concavity 131 is slightly larger than an outer diameter of the solder ball 117, and vertical length of the concavity 131 is sized to be equal to or less than the outer diameter of the solder ball 117. In addition, a diameter of the suction passage 129 which continues to the concavity 131 is sized to be smaller than the diameter of the inner circumferential wall of the concavity 131. Therefore, when a suction force is given to the suction passage 129 from the suction portion 133, the suction force is given to the solder ball 117 through the concavity 131, and one solder ball is contained and held inside the concavity 131.

In addition, an end portion in a side of the suction passage 129 at a side of the top face 101a is further connected to a gas supply portion 135 which supplies a compressed gas. That is, the suction passage 129 functions also as a gas supply passage. A gas supply route for giving the compressed gas supplied from the gas supply portion 135 to a solder member is constituted by the suction passage 129, the concavity 131, an internal space 109 mentioned later, and the containing portion 113. The compressed gas is given to the solder ball through a gas supply route to cause the solder ball to be injected. In addition, an inert gas such as nitrogen is used as the compressed gas.

Next, the nozzle assembly 103 will be explained. The nozzle assembly 103 is constituted by the nozzle 107 for injecting a solder member, and the nozzle body 105 for supporting the nozzle 107. The nozzle body 105 has an approximately conical cylindrical shape, and the internal space 109 provided in its inside has a tapered-off shape.

A diameter of a solder inlet 109a which is an opening of the nozzle body 105 at a side of the top face 105a is sized so that the concavity 131 may be located within an opening region of the solder inlet 109a with the solder supply portion 101 mounted on the top face 105a of the nozzle body 105. Therefore, when holding is released, the solder ball 117 held in the concavity 131 freely falls into the internal space 109 of the nozzle body 105 from the solder inlet 109a. That is, the internal space 109 functions as a supply route of a solder member.

Furthermore, the internal space 109 of the nozzle body 105 functions also as a laser route along which laser light passes.

An O-ring 121 is mounted on the top face 105a of the nozzle body 105. When the lower face 101b of the solder supply portion 101 and the top face 105a of the nozzle body 105 are mounted, the nozzle body 105 and the solder supply portion 101 closely contact through the O-ring 121. In addition, as means of fixing the solder supply portion 101 to the nozzle assembly 103, known means, such as a mechanism which gives, for example, a load, which is larger than internal pressure of the internal space 109, to the solder supply portion 101, and presses the solder supply portion 101 to the nozzle assembly, is used.

The nozzle 107 is a tapered-out columnar member, it provides the containing portion 113 therein, and both end portions which face each other open in a longitudinal direction. A top end portion of the nozzle 107 is mounted in the nozzle body 105 and a lower end portion constitutes an opening portion 115 for injecting the solder ball 117 out of the nozzle.

A diameter of an internal wall of the containing portion 113 of the nozzle 107 is at least larger than the outer diameter of the solder ball 117, which has the construction that the solder ball 117 can be rolled inside the nozzle 107 freely. A diameter of the opening portion 115 is sized so as to be slightly smaller than the outer diameter of the solder ball 117. Therefore, the solder ball 107 is held in the containing portion 113 near the opening portion 115.

In addition, an inside of the nozzle 107 also constitutes a laser light passage along which laser light passes. In this embodiment, respective members are arranged so that central axes of the laser introducing passage 119 of the solder supply portion 101, the internal space 109 of the nozzle body 105, the containing portion 113 of the nozzle 107, and the opening portion 115 may be aligned in a straight line. Therefore, laser light which passed through the laser introducing passage 119 advances into the internal space 109, passes along the containing portion 113 of the nozzle 107, and irradiates the solder ball 117.

Furthermore, when the above-mentioned solder supply portion is mounted in the nozzle assembly, the laser introducing passage 119, internal space 109, and containing portion 113 are in a sealing state except the opening portion 115.

In the soldering apparatus with the above-mentioned construction, conveying process of the solder ball 117 is performed as follows. The suction portion 133 is driven for the solder ball 117 to be adsorbed and held on the concavity 131. The solder supply portion 101 in the state in which the solder ball 117 is adsorbed and held is moved in an x direction (refer to FIG. 1B), and the solder supply portion 101 is mounted in the nozzle assembly 103 (refer to FIG. 1A). After mounting, the suction force from the suction portion 133 to the solder ball 117 is released for the solder ball 117 to be allowed to freely fall into the internal space 109. Through the internal space 109 and the containing portion 113 of the nozzle 107, the solder ball 117 arrives near the opening portion 115, and is held.

Operation of the soldering apparatus using the solder supply portion 101 with the above-mentioned construction is performed as follows.

The conveying process of the solder ball 117 is finished, and the soldering apparatus 100 where the solder ball 117 is loaded is positioned. The soldering apparatus is moved so that the nozzle opening portion 115 may be located in a position apart by a predetermined distance upward in a vertical direction from an almost center position of the groove 159 which is formed by the slider electrode 153, to which the melted solder ball 117 adheres, and the flexure electrode 157. As a moving mechanism, known construction which can move an object in triaxial directions (x-axis, y-axis, and z-axis) is used, for example.

Laser light oscillated from the not-shown laser equipment passes the laser transmission portion 127, passes through the laser introducing passage 119 and internal space 109, irradiates the solder ball 117 held near the opening portion 115, and melts the solder ball 117.

The melted solder ball 117 is injected from the opening portion 115 by a compressed gas being given from the gas supply portion 135 connected to the suction passage 129. Since the solder ball 117 closes the opening portion 115 at this time, the suction passage 129, the internal space 109, and the containing portion 113 form a closed space.

Then, the melted solder ball injected adheres to a predetermined position, and soldering is completed. According to a soldering apparatus equipped with the above-mentioned solder supply portion, since a solder ball can be held in a closed space, it is possible to set a pressure value of the compressed gas used for injection at a predetermined value certainly and easily, and to inject a solder ball securely.

Embodiment 2

Figure 2:
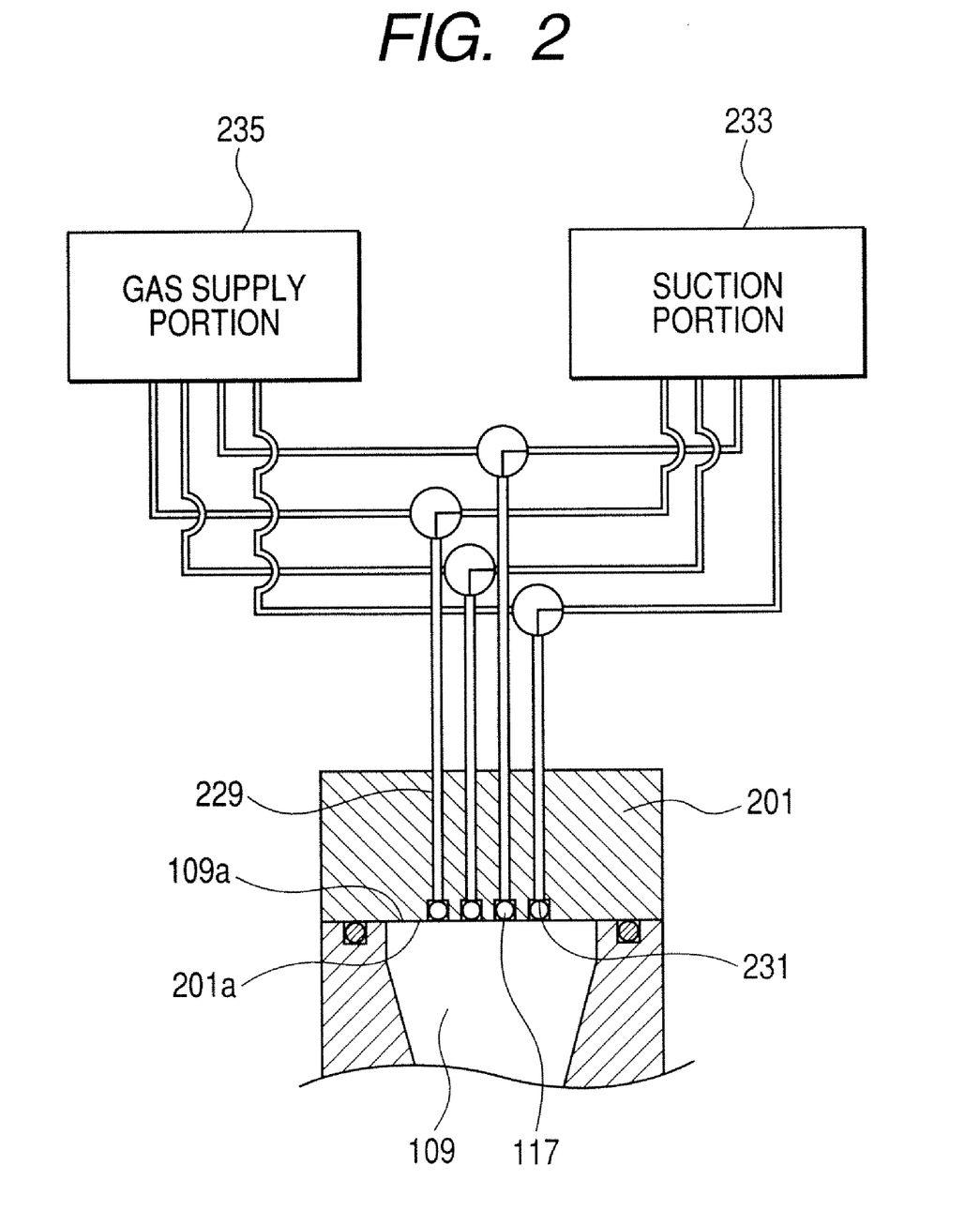
FIG. 2 is a sectional view showing a part of a soldering apparatus according to a second embodiment of the present invention.

Although the solder supply portion 101 in the above-mentioned first embodiment has a construction of conveying a single solder ball, a second embodiment is a soldering apparatus equipped with a solder supply portion 201 holding a plurality of solder balls. Hence, only different portions from the first embodiment will be explained. FIG. 2 is a partial sectional view of the soldering apparatus in the second embodiment taken on line which is similar to a line II-II in FIG. 1.

The solder supply portion 201 provides concavities 231, arranged at equal intervals in an almost straight line, in its lower face 201a. Four concavities 231 are provided in this second embodiment. All the concavities 231 are arranged in an opening region inside a diameter of the solder inlet 109a. Hence, when a suction force to each solder ball 117 is released, each solder ball 117 freely falls into the internal space 109.

In addition, each suction passage 229 is connected to each concavity 231. Each concavity 231 and each suction passage 229 have the same shapes and sizes as those of the concavity 131 and suction passage 129 in the first embodiment. Furthermore, each suction passage 229 is connected to a suction portion 233.

The suction portion 233 can independently give and hold a suction force to each of the plurality of concavities 231. In addition, it is possible to independently release and drop each solder ball 117 held at the plurality of concavities 231.

In addition, the suction passage 229 is connected also to the gas supply portion 235, and is constituted so as to be switchable between the suction portion 233 and gas supply portion 235 by a switching valve, or the like. Then, the melted solder ball 117 is injected from an opening portion (refer to 115 in FIGS. 1A and 1B) by supplying an inert gas from the gas supply portion 235. In addition, this is constituted so that each of the concavities 231 can be used independently of the suction portion 233 and gas supply portion 235.

According to the above-mentioned construction, a suction force to one among the solder balls 117 held in respective concavities 231 is released, and the solder ball 117 is supplied to the containing portion 113 of the nozzle. After the solder ball 117 is given heat rays, the solder ball is injected by a compressed gas being supplied to the containing portion 113 from the gas supply portion 235. Next, a solder ball 117 in another concavity 231 is supplied to the containing portion of the nozzle, and the melted solder ball is injected similarly. This is performed one by one and soldering with four solder balls is completed.

According to the above-mentioned construction, after conveying the number of solder members corresponding to soldering locations (four locations in this embodiment) into the internal space and making the internal space into a closed space, the solder balls are injected from the internal space. Therefore, since soldering with the corresponding number of solder members concerned can inject the solder balls under the same environment, it is possible to maintain soldering quality uniformly.

In addition, by making the number of the solder balls, which the solder supply portion 201 can hold at once, the same as a number of the soldered locations (soldered portions) in a soldered member (electronic part), it becomes unnecessary to convey a solder member each time one soldered portion is soldered, and hence, it is possible to reduce tact time of a soldering process efficiently. For example, when the number of soldered portions is four, conveying operation is unnecessary until the soldering process of the following soldered member finishes by the solder supply portion 201 adsorbing four solder members from a not-shown storage portion and performing the operation of conveying the four solder members once to the concavities 131 in exchanging process of soldered members after soldering four locations of one soldered member continuously using four solder members held in the solder supply portion 201. In this way, it is possible to reduce the tact time in comparison with the construction of conveying a solder ball each time one location is soldered.

Embodiment 3

Figure 3A:
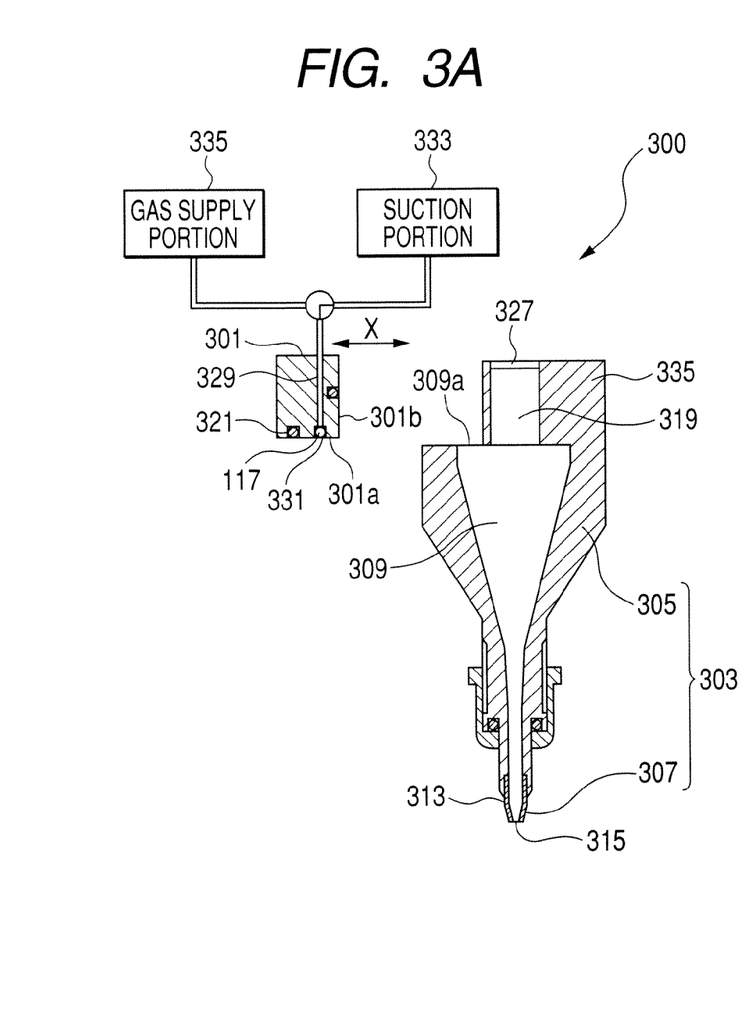
FIG. 3A is a partial sectional view of a soldering apparatus, where laser equipment is separated, according to a third embodiment of the present invention.
Figure 3B:
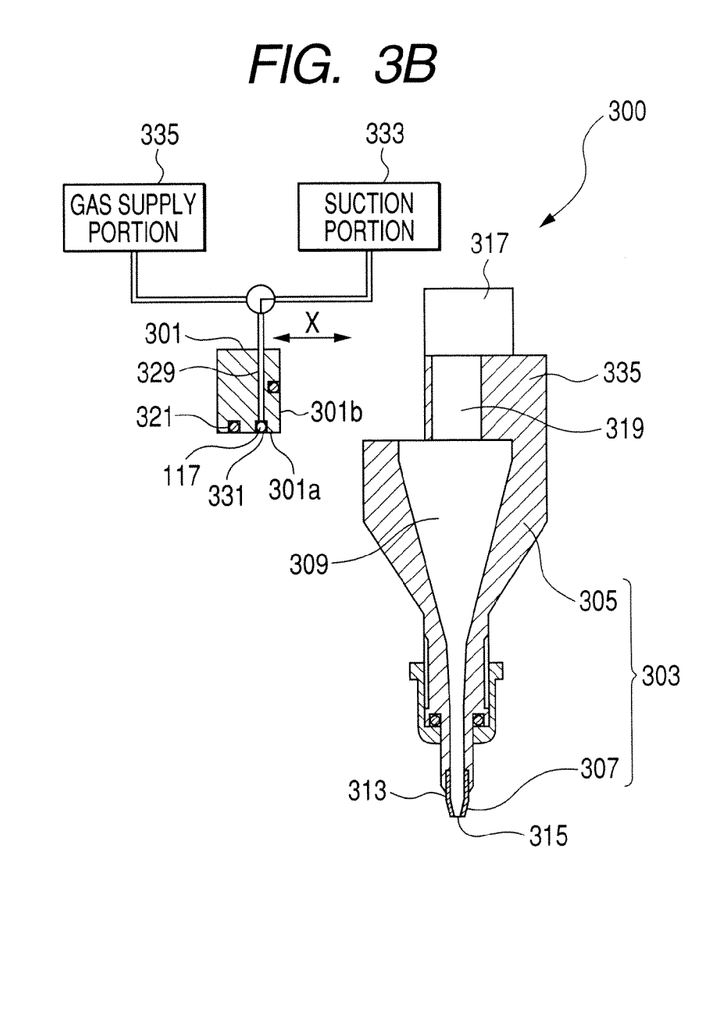
FIG. 3B is a partial sectional view of the soldering apparatus, including the laser equipment, according to the third embodiment of the present invention.

FIG. 3A is a partial sectional view of a soldering apparatus 300 where laser equipment with a solder supply portion 301 according to a third embodiment of the present invention is separately arranged, and FIG. 3B shows a partial sectional view of the soldering apparatus where the laser equipment with the solder supply portion 301 is fixed. Since the difference between FIGS. 3A and 3B is the presence of laser equipment, the soldering apparatus according to the third embodiment will be explained mainly using FIG. 3A.

The solder supply portion 101 in FIG. 1 has the construction of providing the laser transmission portion 127 which can introduce laser light. But, the solder supply portion 301 of the soldering apparatus 300 according to the third embodiment has the construction in which the solder supply portion 301 does not provide a laser transmission portion, but a nozzle assembly 303 provides a laser transmission portion 327. In addition, this embodiment has the construction in which the soldering apparatus 100 shown in FIG. 1A is partially cut in a vertical direction, and is made into the solder supply portion 301 and nozzle assembly 303, respectively.

The solder supply portion 301 has an approximately semicolumner shape, and similarly to the first embodiment, the solder supply portion 301 is equipped with a concavity 331, a suction passage 329, and a suction portion 333 and a gas supply portion 335 which are connected to the suction passage 329. Furthermore, seals 321 are installed on bonding surfaces 301a and 301b of the solder supply portion 301 which contacts the nozzle assembly, and form a closed region including a concavity 331. When the solder supply portion 301 is mounted in the nozzle assembly 303, the solder supply portion 301 and nozzle assembly 303 closely contact through the seals 321.

With referring to FIG. 3A, the nozzle assembly 303 is constituted by a nozzle body 305 equipped with a laser introducing passage 319, and a nozzle 307 supported by the nozzle body 305. In a top portion 335 of the nozzle body 305, the laser introducing passage 319 communicating with an internal space 309, and a laser transmission portion 327 which can transmit laser light and is mounted on a top of the laser introducing passage 319 are provided. The laser introducing passage 319 has the construction of being sealed by the laser light transmission portion 327 formed by a glass-containing material and being able to transmit only laser light.

In addition, in a state in which the solder supply portion 301 holding the solder ball 117 in the concavity 331 is mounted with the nozzle assembly 303, similarly to the above-mentioned first and second embodiments, and the like, the suction passage 329 and internal space 309, and the containing portion 313 constitute a closed space except an opening portion 315.

In the above-mentioned construction, the solder supply portion 301 which sucks and holds the solder ball 117 in the not-shown storage portion is moved in an x direction to be mounted in the nozzle assembly 303. When a suction force from the suction portion 333 is released, the solder ball falls into the internal space 309 to stop near the opening portion 315 in the containing portion 313.

Next, laser light from laser equipment not shown radiates and melts the solder ball 117 through the laser transmission portion 327. Since a compressed gas is introduced into the internal space 308 from the gas supply portion 335, the melted solder ball is injected from the opening portion 315.

The soldering apparatus equipped with the laser equipment according to the third embodiment which is shown in FIG. 3B has the construction of directly fixing the laser equipment 317 to the solder introducing passage of the laser equipment in FIG. 3A as mentioned above. It does not relate to moving operation of the solder supply portion 301 to directly fix the laser equipment 317 to the nozzle assembly 303, which is never given a load to a fiber, wiring, or the like which is not shown and is connected to the laser equipment 317. Other construction and operation of the soldering apparatus in FIG. 3B is the same as that in FIG. 3A.

According to the above-mentioned first to third embodiments, since the multi-hole disk used in Japanese Patent Application Laid-Open No. 11-534409 is not used, there is no possibility that the multi-hole disk cause clogging with a solder member by deforming the solder member or generating chippings of the solder member owing to biting of the solder member.

In addition, when a multi-hole disk is provided in a solder supply portion, it is difficult to miniaturize a soldering apparatus, and to simplify construction since a limit exists in miniaturizing a multi-hole disk. But, it is possible to achieve miniaturization and simplification of construction by using a solder supply portion.

As for the soldering apparatus according to the third embodiment, as shown in FIG. 3B, although the construction of directly fixing the laser equipment 317 to the nozzle assembly 303 is adopted, it is also good to adopt the construction of fixing laser equipment to a laser introducing passage also in the above-mentioned first and second embodiments.

Furthermore, it is also good to adopt the construction of using halogen light instead of the laser light from laser equipment through the first to third embodiments. Moreover, in the case of FIG. 3B where the laser transmission portion 327 is not needed, it is also good to adopt the construction of melting a solder ball, i.e., a solder member by using a hot blast instead of laser light.

Each nozzle in the above-mentioned first to third embodiments is a tapered-off cylindrical member, and the diameter of the opening portion is sized so as to be slightly smaller than the outer diameter of the solder ball. But, the present invention is not restricted to this construction. That is, it is also good to adopt the construction in which a diameter of an opening portion of a nozzle is larger than outer diameter of a solder ball, and in order to hold the solder ball near the opening portion, a stopper for closing the opening portion is provided, or a suction force is given to a solder member to absorb and hold the solder member near the opening portion.

When dropping a solder ball by releasing a suction force from a suction portion in each of the above-mentioned first to third embodiments, it is also good to adopt the construction in which a solder ball is dropped securely by not only releasing a suction force, but also supplying a little amount of gas to make negative pressure, remaining in a suction route, approximately atmospheric pressure or a little higher pressure than atmospheric pressure.

The solder dispenser of the present invention is not limited to the construction applied to the soldering apparatus using the nozzle described in each of the first to third embodiments. It is needless to say that the solder dispenser of the present invention is applicable so long as it is an apparatus aiming at supplying a solder member to a predetermined place.

According to the present invention, since a solder member which is sucked and held in a lid portion freely falls from a solder inlet and arrives at an opening portion, it is possible to prevent solder clogging in the middle of conveying the solder member.

According to the present invention, it is possible to make an internal space into a closed space by plugging a solder inlet by mounting a lid member in a solder dispensing container, and plugging an opening portion with a solder member. Therefore, it is possible to securely control a pressure value of a compressed gas introduced into an internal space to a predetermined value when injecting a solder member, and hence, it is possible to securely inject the solder member.

In addition, since it is not necessary to use a multi-hole disk which makes miniaturization and simplification of construction difficult, it is possible to achieve the miniaturization and simplification of construction of a solder dispenser.

This invention can be actualized as many forms without deviating from its essential character. Therefore, it is needless to say that the embodiments mentioned above are just for explanation, and do not restrict the present invention.

This application claims priority from Japanese Patent Application No. 2005-124607 filed on Apr. 22, 2005, which is hereby incorporated by reference herein.

What is claimed is:

1. A soldering apparatus for injecting a solder member and soldering an electronic part on a substrate, comprising:
 a nozzle assembly which has an internal space for containing a solder member, a solder inlet communicating with the internal space for introducing the solder member into the internal space, and an opening portion communicating with the internal space for discharging the solder member to the external; and
 a solder supply portion which is detachably mounted in the nozzle assembly and which holds the solder member, wherein the nozzle assembly or the solder supply portion has a heat ray route which introduces heat rays for melting the solder member into the internal space, and the solder supply portion has a suction hole communicating with a suction source and holds the solder member by giving a suction force from the suction source to the solder member through the suction hole, wherein in a state that the solder supply portion is mounted in the nozzle assembly, the solder supply portion holds the solder member in the opening region of the solder inlet and the internal space becomes a closed space except the opening portion.

2. The soldering apparatus according to claim 1, wherein the solder supply portion has a gas supply passage to which a compressed gas source is connected and a compressed gas is supplied, and the gas supply passage communicates with the internal space in a state that the solder supply portion is mounted in the nozzle assembly.

3. The soldering apparatus according to claim 1, wherein the solder supply portion can hold a plurality of solder members.

4. The soldering apparatus according to claim 2, wherein the heat ray route is a laser light transmission portion which can transmit laser light.

5. A solder dispenser for dispensing a solder member, comprising:

a cylindrical dispensing container which has a solder inlet for introducing the solder member, and an opening portion for discharging the solder member to the external, and forms an internal space where the solder member can fall between the solder inlet and the opening portion; and a lid member which is detachably mounted in the dispensing container and holds the solder member, wherein the solder supply portion holds the solder member in the opening region of the solder inlet in a state that the lid member is mounted in the dispensing container, and the internal space becomes a closed space except the opening portion, and the lid member has a suction hole communicating with a suction source and holds the solder member by giving a suction force from the suction source to the solder member through the suction hole, wherein when holding of the solder member is released, the solder member falls inside a closed space to arrive at the opening portion.

* * * * *